US011502493B2

(12) United States Patent
Auer

(10) Patent No.: US 11,502,493 B2
(45) Date of Patent: Nov. 15, 2022

(54) DOUBLE-WALLED CABINET WITH EXTERNAL ELECTRICAL CONNECTIONS

(71) Applicant: Justrite Manufacturing Company, L.L.C., Deerfield, IL (US)

(72) Inventor: Ronald Frank Auer, Mattoon, IL (US)

(73) Assignee: JUSTRITE MANUFACTURING COMPANY, L.L.C., Deerfield, IL (US)

( * ) Notice: Subject to any disclaimer, the term of this patent is extended or adjusted under 35 U.S.C. 154(b) by 195 days.

(21) Appl. No.: 17/155,866

(22) Filed: Jan. 22, 2021

(65) Prior Publication Data

US 2021/0234351 A1 Jul. 29, 2021

Related U.S. Application Data

(60) Provisional application No. 62/966,393, filed on Jan. 27, 2020.

(51) Int. Cl.
*H02G 3/22* (2006.01)
*B01L 1/00* (2006.01)

(52) U.S. Cl.
CPC . *H02G 3/22* (2013.01); *B01L 1/50* (2013.01)

(58) Field of Classification Search
CPC ........ B01L 1/50; H05K 5/069; H02G 3/0412; H02G 3/22
See application file for complete search history.

(56) References Cited

U.S. PATENT DOCUMENTS

| 3,623,785 | A | 11/1971 | Williams |
| 4,262,448 | A | 4/1981 | Flider |
| 4,619,076 | A | 10/1986 | Livingston |
| 5,109,467 | A | 4/1992 | Hogan et al. |
| 5,473,845 | A | 12/1995 | Livingston et al. |
| 5,992,098 | A | 11/1999 | Flider et al. |
| 6,260,725 | B1 * | 7/2001 | Gonzales ................ F16K 27/12 220/4.21 |
| 6,354,104 | B1 * | 3/2002 | Feagin ............... A61B 10/0096 70/68 |

(Continued)

FOREIGN PATENT DOCUMENTS

| AU | 2013200043 A1 | 1/2013 |
| AU | 2015200986 A1 | 4/2015 |
| AU | 2016247181 A1 | 1/2017 |

*Primary Examiner* — Timothy J Thompson
*Assistant Examiner* — Rhadames Alonzo Miller
(74) *Attorney, Agent, or Firm* — Dorsey & Whitney LLP

(57) ABSTRACT

Methods for installing electronic connections into a Factory Mutual certified cabinet may comprise providing a double walled cabinet. The double walled cabinet ay comprise an outer cabinet wall, and inner cabinet wall, and an airgap between the inner cabinet wall and the outer cabinet wall. The method may comprise the steps of including a first large hole in a surface of the outer cabinet wall and including a first small hole in a surface of the inner cabinet wall. Methods can additionally include the steps of inserting a first bulkhead fitting into the first small hole in the surface of the inner cabinet wall via the first large hole and covering the first large hole in the surface of the outer cabinet wall. Methods may additionally include the first small hole at least partially overlapping the first large hole when viewed from a plane normal to the first large hole.

20 Claims, 6 Drawing Sheets

(56) References Cited

U.S. PATENT DOCUMENTS

| | | |
|---|---|---|
| 6,695,421 B1 * | 2/2004 | Frase .................. H02B 1/28 |
| | | 312/409 |
| 6,729,701 B2 | 5/2004 | Carter et al. |
| 9,630,036 B2 | 4/2017 | Strum et al. |
| 9,814,311 B2 | 11/2017 | Mueller et al. |
| 10,392,801 B2 | 8/2019 | Cornia et al. |
| 2004/0066122 A1 | 4/2004 | Holmes |
| 2004/0228598 A1 * | 11/2004 | Allen .................. G02B 6/4452 |
| | | 385/135 |
| 2006/0222309 A1 | 10/2006 | Grubish et al. |
| 2007/0181583 A1 * | 8/2007 | Zacharias ............ B65D 90/028 |
| | | 220/563 |
| 2008/0106174 A1 | 5/2008 | Marcus et al. |
| 2009/0085447 A1 | 4/2009 | McLuckie et al. |
| 2012/0242208 A1 | 9/2012 | Eyer et al. |

* cited by examiner

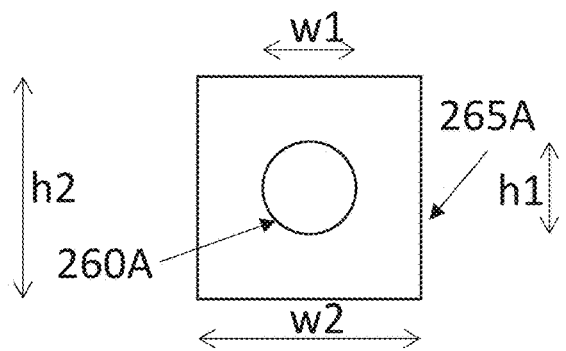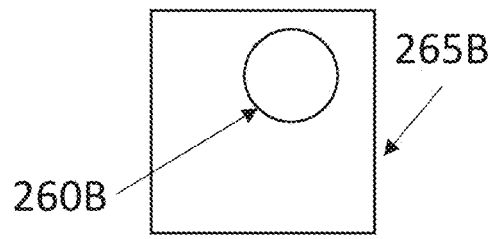
FIG. 2A  FIG. 2B
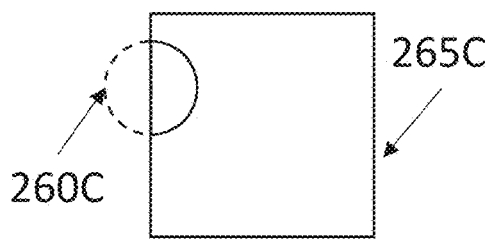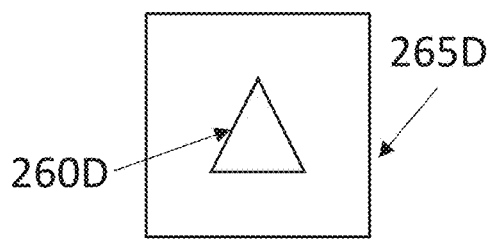
FIG. 2C  FIG. 2D
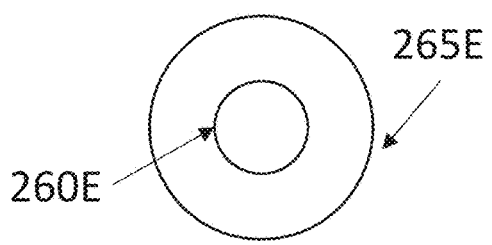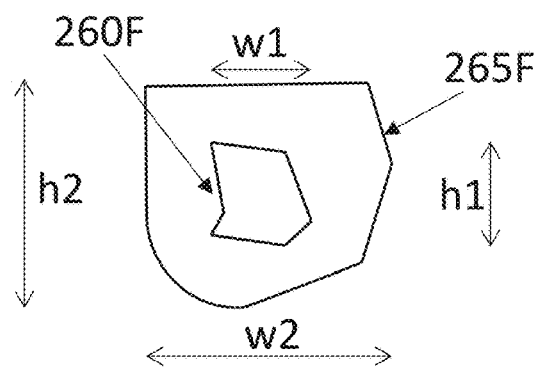
FIG. 2E  FIG. 2F
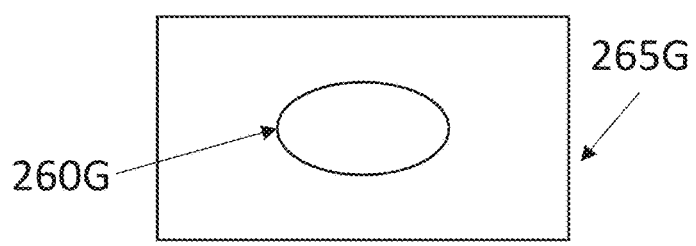
FIG. 2G

DOUBLE-WALLED CABINET WITH EXTERNAL ELECTRICAL CONNECTIONS

RELATED APPLICATIONS

This application claims priority to U.S. Patent Application No. 62/966,393 filed Jan. 27, 2020, the entire contents of which are incorporated herein by reference.

BACKGROUND

Safety cabinets can be used in a variety of ways, such as to protect people and facility from potentially hazardous conditions. For example, Justrite safety cabinets are engineered to safety contain flammable fuels, solvents, and chemicals while complying with federal Occupational Safety and Health Administration (OSHA) regulations and the National Fire Protection Association (NFPA).

In general, safety cabinets have been designed provide an isolated environment within the safety cabinet, such that if there is a hazardous environment within the safety cabinet, the environment outside the safety cabinet does not become hazardous and also if there is a hazardous environment outside the safety cabinet, the environment within the safety cabinet does not become hazardous.

In some embodiments, a double-walled or triple-walled safety cabinet is used to provide an isolating barrier between the inside environment of the safety cabinet and the outside environment. However, in such designs installing an electrical connection between the inside and outside of the cabinet may be hard to install while maintaining compliance with Factory Mutual (FM) regulations. Therefore, there is a need to provide a safety cabinet with electrical connections that still comply with FM regulations.

SUMMARY

Embodiments described herein generally relate to systems and methods for installing electronic connections into a Factory Mutual (FM) certified cabinet. The method may comprise providing a double walled cabinet. In some embodiments, the double walled cabinet may comprise an outer cabinet wall, and inner cabinet wall, and an airgap between the inner cabinet wall and the outer cabinet wall. Furthermore the method may comprise the steps of including a first large hole in a surface of the outer cabinet wall and including a first small hole in a surface of the inner cabinet wall. In some instances, the first large hole may be larger than the first small hole. Additionally or alternatively, the first small hole may at least partially overlap the first large hole when viewed from a plane normal to the first large hole, such as having the first small hole be centered in the first large hole when viewed from the plane normal to the first large hole. The method may additionally comprise inserting a first bulkhead fitting into the first small hole in the surface of the inner cabinet wall via the first large hole as well as covering the first large hole in the surface of the outer cabinet wall. In some embodiments, covering the first large hole comprises riveting a first cover around the first large hole.

In some embodiments, in addition to inserting the first bulkhead fitting into the first small hole, the method may comprise securing the first bulkhead fitting into the first small hole. Furthermore, securing the first bulkhead fitting into the first small hole may comprise providing a relatively airtight seal. Additionally or alternatively, the first bulkhead fitting may comprise a coaxial bulkhead.

In some embodiments, the first small hole may comprise a notch, and inserting the first bulkhead fitting into the first small hole via the first large hole may comprise aligning the first bulkhead fitting with the notch.

In some embodiments, the method may comprise including a plurality of large holes and/or a plurality of small holes. For example, the method may comprise including a second large hole in the surface of the outer cabinet wall and including a second small hole in the surface of the inner cabinet wall, wherein the second large hole is larger than the second small hole. Furthermore, the method may comprise inserting a second bulkhead fitting into the second small hole and covering the second large hole in the surface of the outer cabinet wall with a cover. In some embodiments, covering the second large hole may comprise using a second cover. Additionally or alternatively, a single cover (e.g. the first cover) may be configured to cover both the first large hole and the second large hole.

BRIEF DESCRIPTION OF DRAWINGS

The following drawings are illustrative of particular embodiments of the invention and therefore do not limit the scope of the invention. The drawings are not necessarily to scale (unless so stated) and are intended for use with the explanations in the following detailed description. Embodiments of the invention will hereinafter be described in conjunction with the appended drawings, wherein like numerals denote like elements.

FIGS. 2A-2G illustrate some exemplary configurations of a small hole and a large hole when viewed from a plane normal to the large hole.

DETAILED DESCRIPTION

The following detailed description is exemplary in nature and is not intended to limit the scope, applicability, or configuration of the invention in any way. Rather, the following description provides some practical illustrations for implanting various embodiments of the present invention. Those skilled in the art will recognize that many of the noted examples have a variety of suitable alternatives.

Various embodiments as described herein describe a double-walled cabinet comprising an electrical connection which complies with FM regulations as well as a method of installing an electrical connection in an FM certified cabinet.

Figure 1:
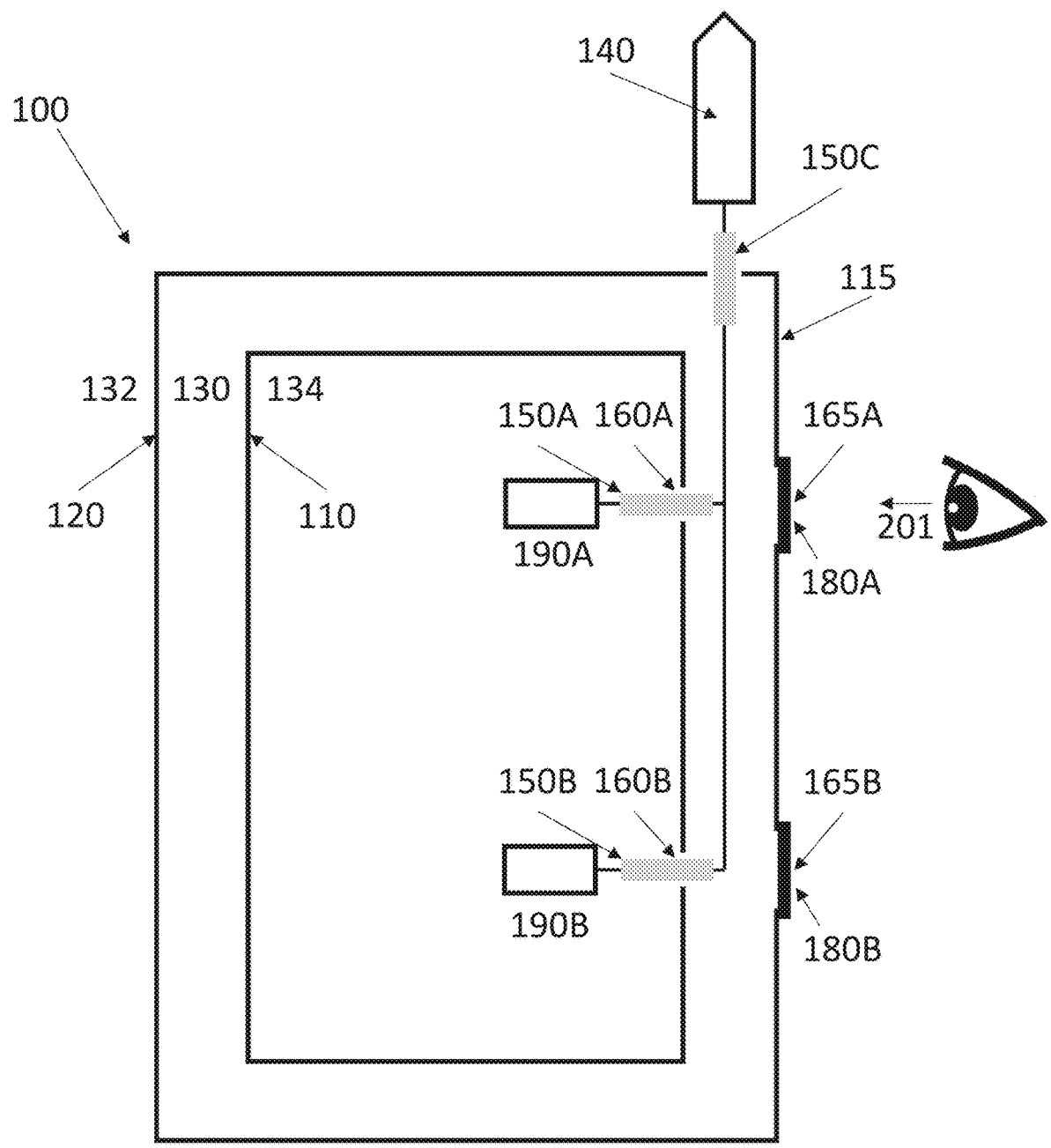
FIG. 1 provides an exemplary embodiment of a double-walled cabinet.

FIG. 1 provides an exemplary embodiment of a double-walled cabinet 100 may comprise an inside cabinet wall 110, an exterior cabinet wall 120, and an airgap 130 therebetween. As shown, the double-walled cabinet 100 can isolate or partially isolate the external environment 132 from the internal environment 134.

Double-walled cabinet 100 may be various shapes and sizes known to one of ordinary skill in the art. For example, double-walled cabinet may comprise a rectangular shape (shown in FIG. 1), or may comprise various other shapes such as cylinders, domes, various prisms, or the like. Additionally or alternatively, double-walled cabinet 100 may have a capacity of 30 gallons, 45 gallons, 90 gallons, or any other size known to one of ordinary skill in the art. In some embodiments, double-walled cabinet 100 may comprise a plurality of cabinets and/or cabinet sections positioned together. Furthermore, double-walled cabinet may comprise a variety of colors, such as yellow, red, grey, and white.

In some embodiments, it may be beneficial to provide a connection between components located in the internal environment 134 and the external environment 132. Various components may be housed within the double-walled cabinet 100 that either transmit power, data, etc. and/or receive power, data, etc. Furthermore, the double-walled cabinet 100 may comprise an output to external electronics 140 located externally from double-walled cabinet 100. In some embodiments, the external electronics 140 may be located adjacent to the cabinet, such as on the top, on the side, or beneath the cabinet. Additionally or alternatively, external electronics 140 may be located elsewhere, such as on a different cabinet and/or in a location different than the double-walled cabinet 100. In some embodiments, it may be beneficial to provide an electrical connection between the external electronics 140 and the internal environment 134. In such embodiments, the electrical connection may be a physical connection, such as via electrical data cable, optical data cable, electrical power cables, etc. The external electronics 140 may comprise an antenna and/or transmitter located external to the double-walled cabinet 100 to wirelessly transmit data to further external electronics 140. In a non-limiting example, various internal electrical equipment 190A, 190B may be electrically connected to the external electronics 140. Such internal electronic equipment may be used to provide a multitude of different functions (e.g., sensing, computing, communication, storage).

When providing electrical connections between the internal environment 134 to the external environment 132, such as between internal electronics 190A, 190B and external electronics 140, one may simply include a hole for allowing a wire to traverse between the internal environment 134 and the external environment 132. However, simply including holes for wiring can allow for airflow between the internal environment 134 and the external environment 132 and thus may compromise any FM Approvals, such as FM 6050, or the like.

To help insulate the between the internal environment 134 and the external environment 132, one of ordinary skill in the art may use bulkhead fittings 150A, 150B to help isolate the internal environment 134 from the external environment 132. In some instances, such as shown in FIG. 1, the bulkhead fittings 150A, 150B may be placed within small holes 160A, 160B provided on the inside cabinet wall 110. To help maintain isolation between the internal environment 134 and the external environment 132, the bulkhead fitting may comprise a coaxial bulkhead, such as a metal coaxial bulkhead, or a different type of connector used to provide a connection through a wall (e.g. inside cabinet wall 110 and/or exterior cabinet wall 120). In some embodiments, bulkhead fittings 150 provides a connection through a wall while minimizing airflow. Furthermore, in embodiments wherein the external electronics 140 is located on the top of the double-walled cabinet 100, an additional bulkhead fitting 150C may be used to provide cabling from the airgap 130 to the external electronics 140.

However, it may be difficult to install the bulkhead fittings 150A, 150B may be cumbersome and difficult. Furthermore, in examples comprising retrofitting a pre-existing cabinet, including small holes 160A, 160B can be additionally cumbersome. For example, including small holes 160A-160B from the interior of the double-walled cabinet may difficult, resulting in additional time to install or improper installment. Additionally, cutting small holes 160A, 160B may be potentially dangerous, as a user may be subject to sparks and debris.

In order to obviate such difficulties, the present invention additionally includes large holes 165A, 165B located on the exterior cabinet wall 120 of the double-walled cabinet 100. More specifically, the present invention may comprise including a large holes 165A, 165B for each respective small hole 160A, 160B. Furthermore, each large holes 165A, 165B may be covered, such as by covers 180A, 180B in order to provide isolation between the internal environment 134 and the external environment 132. Covers 180A, 180B may be formed as cover plates that are sized and shaped to cover and/or close one or more respective large holes 165A, 165B. Covers may be sealed to the exterior cabinet wall 120 of the double-walled cabinet 100 in a form that maintains FM integrity, such as via rivets, screws, etc. In some embodiments, cover 180A, 180B may comprise similar materials to inside cabinet wall 110 and/or exterior cabinet wall 120. Additionally or alternatively, covers 180A, 180B may comprise fire retardant materials such as metals and metal alloys.

In some embodiments, such as the embodiment shown in FIG. 1, the small holes 160A, 160B and large holes 165A, 165B may be located on a single side, such as side 115. Side 115 may be any side of the double-walled cabinet 100. In some embodiments, the holes are located on the backside of the double-walled cabinet 100, such as shown in FIG. 1.

Additionally, even though FIG. 1 illustrates the installation of two bulkhead fittings (e.g. bulkhead fittings 150A, 150B), other amounts of bulkhead fittings may be installed. For instance, one or more bulkhead fittings may be installed. Additionally, FIG. 1 illustrates each bulkhead fitting being installed on the same side of the double-walled cabinet 100 (e.g. side 115). However, when installing more than one bulkhead fitting, the bulkhead fittings need not be installed on the same side. For example, one or more bulkhead fittings 150 may be installed on the backside while one or more bulkhead fittings 150 may be installed on the sides or top of the double-walled cabinet 100.

In some embodiments, one large hole 165 may be used for the multiple bulkhead fittings 150. For instance the opening of the one large hole 165 may project onto an area of the inside wall 110 that encompasses multiple bulkhead fittings 150. In such an example, a single cover 180A or 180B may cover the one large hole 165. Similarly, in embodiments wherein multiple large holes 165 are close together, the one cover 180 may be used to simultaneously cover the multiple large holes 165.

FIGS. 2A-G provide some exemplary configurations of the small hole (e.g. small hole 260A-G) and the large hole (e.g. large hole 265A-G) viewed from a plane normal to the large hole, such as from perspective 201 in FIG. 1. Even though not explicitly shown, other configurations known to one of ordinary skill in the art are known. In preferred embodiments, each large hole allows for a user to insert the bulkhead fitting (e.g. bulkhead fittings 150A, 150B) into the respective small hole.

As shown in FIGS. 2A-G, this can be accomplished by having each small hole (e.g. small holes 260A-G) at least partially overlapping with the respective large hole (e.g. large holes 265A-G) when viewed from a plane normal to the large hole (e.g. perspective 201). As shown, all of small holes 260A-G are shown to be partially overlapping with their respective large holes 265A-G when viewed from perspective 201. For example, even though small hole 260C only partially overlaps large hole 265A. Additionally, the small hole may be centered within the respective large hole (e.g. small holes 260A, 260D, 260E, 260F, and 260G) or may be offset to the respective large hole e.g. small holes 260B and 260C).

Additionally, the small hole (e.g. 260A-G) and large hole (265A-G) may be a variety of shapes, such as any shape known to one of ordinary skill in the art. FIGS. 2A-G provide various shapes for the small hole and large hole. For example, shapes such as circles, squares, rectangles, triangles, irregular shapes and other two-dimensional shapes known to one of ordinary skill in the art. In some embodiments, the size of the small hole (e.g. small hole 260A-G) may be sized to fit a bulkhead fitting (e.g. bulkhead fitting 150). For example, the width (w1) of the small hole may be between 0.125 inches and 4 inches and the height (h1) of the small hole may be between 0.125 inches and 4 inches; however other values, such as a height (h1) and/or width (w1) of less than 0.125 inches and greater than 4 inches has been contemplated. Similarly, the size of the large hole (e.g. large hole 265A-G) may be sized to allow a user to actuate and/or fasten the bulkhead fitting (e.g. bulkhead fitting 150). For example, the width (w2) of the large hole may be between 1 inch and 11 inches and the height (h2) of the large hole may be between 1 inch and 11 inches; however other values, such as a height (h2) and/or width (w2) of less than 1 inch and greater than 11 inches has been contemplated.

Figure 3:
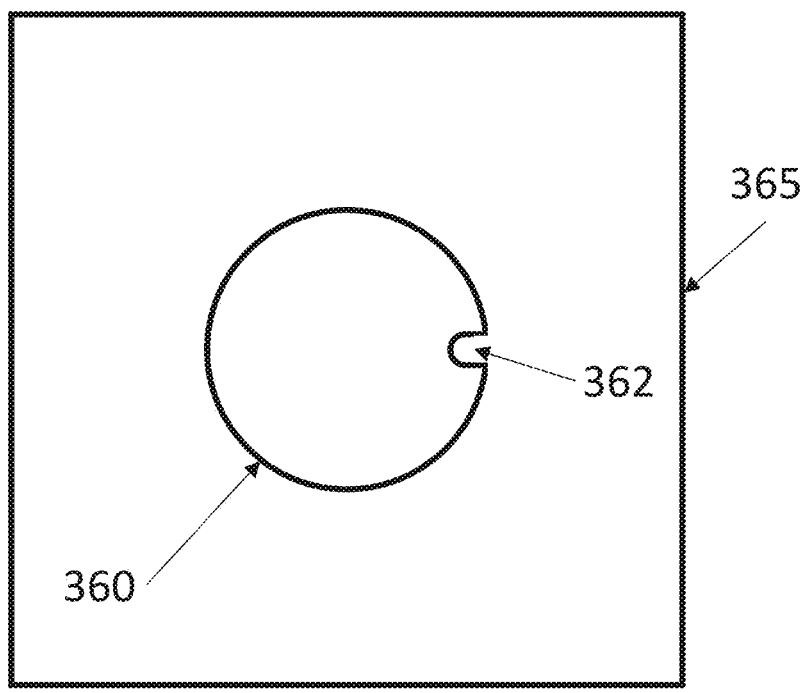
FIG. 3 provides an exemplary illustration of a small hole and a large hole.

In some embodiments, the small hole may be sized to fit a bulkhead fitting (e.g. bulkhead fitting 150A, 150B) in order to provide a sufficient seal. In such embodiments, small hole (e.g. small hole 360) may comprise a notch, such as notch 362 as shown in FIG. 3. Notch 362 may be used to securely fasten a bulkhead fitting into small hole 360. For example, the bulkhead fitting (e.g. bulkhead fitting 150A, 150B) may comprise a complementary recess to receive notch 362. Even though not shown, other sealing and/or latching methods known to one of ordinary skill in the art may be used.

Figure 4:
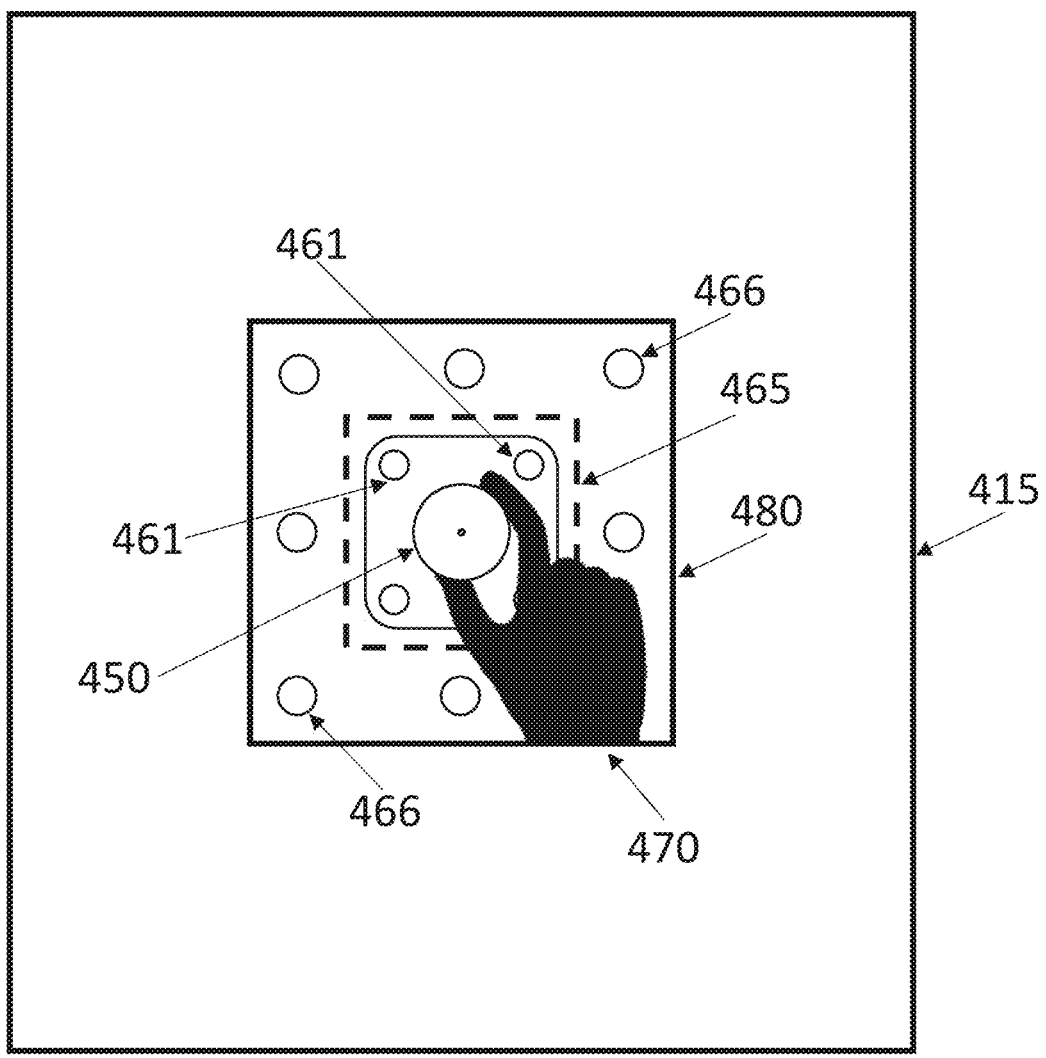
FIG. 4 provides an exemplary illustration of a user installing a bulkhead fitting into a small hole via a large hole.

FIG. 4 provides an exemplary example of a user (e.g. user 470) installing a bulkhead fitting 450 into small hole (not shown) via large hole 465 on a side 415 of the double-walled cabinet 100. In some embodiments, the bulkhead fitting 450 may be fastened into the small hole via a notch/latch system (e.g. notch 362), fastening devices 461 (e.g. screws, bolts, etc.) or another fastening/sealing mechanism known to one of ordinary skill in the art.

As shown in FIG. 4, large hole 465 may be covered to help isolate the external environment 132 from the internal environment 134. In some examples, large hole 465 may be covered with a cover, such as cover 480. Covering the large hole with a cover is additionally shown with respect to FIG. 1. With respect to FIG. 1, each large hole (e.g. large hole 165A, 165B) is covered by a respective cover 180A, 180B, located on the exterior cabinet wall 120 of double-walled cabinet 100.

Turning back to FIG. 4, each cover may be secured to the side (e.g. side 415). In some embodiments, the cover 480 may be a similar shape to large hole 465, however alternative shapes may be used. For example, the width of cover 480 may be between 3 inches and 12 inches and the height of cover 480 may be between 3 inches and 12 inches; however, other heights and widths, such as less than 3 inches and greater than 12 inches have been contemplated. In preferred embodiments, cover 480 may be larger than large hole 465. For example, cover 480 may have a height which is 0.5 inches to 2 inches larger than the height of large hole 465 and have a width which is 0.5 inches to 2 inches larger than the width of large hole 465; however, heights and/or widths which are less than 0.5 inches greater than the height and/or width of large hole 465 and greater than 2 inches larger than the height and/or width of large hole 465 have been contemplated. In some embodiments, cover 480 is secured onto side 415. Cover 480, similar to covers described elsewhere in the current disclosure, may comprise materials resistant to fire, such as various metals and/or metal alloys. In such embodiments, cover 480 may be secured by welding the cover around large hole 465 (not shown) or with rivets, such as rivets 466 of FIG. 4.

Figure 5A:
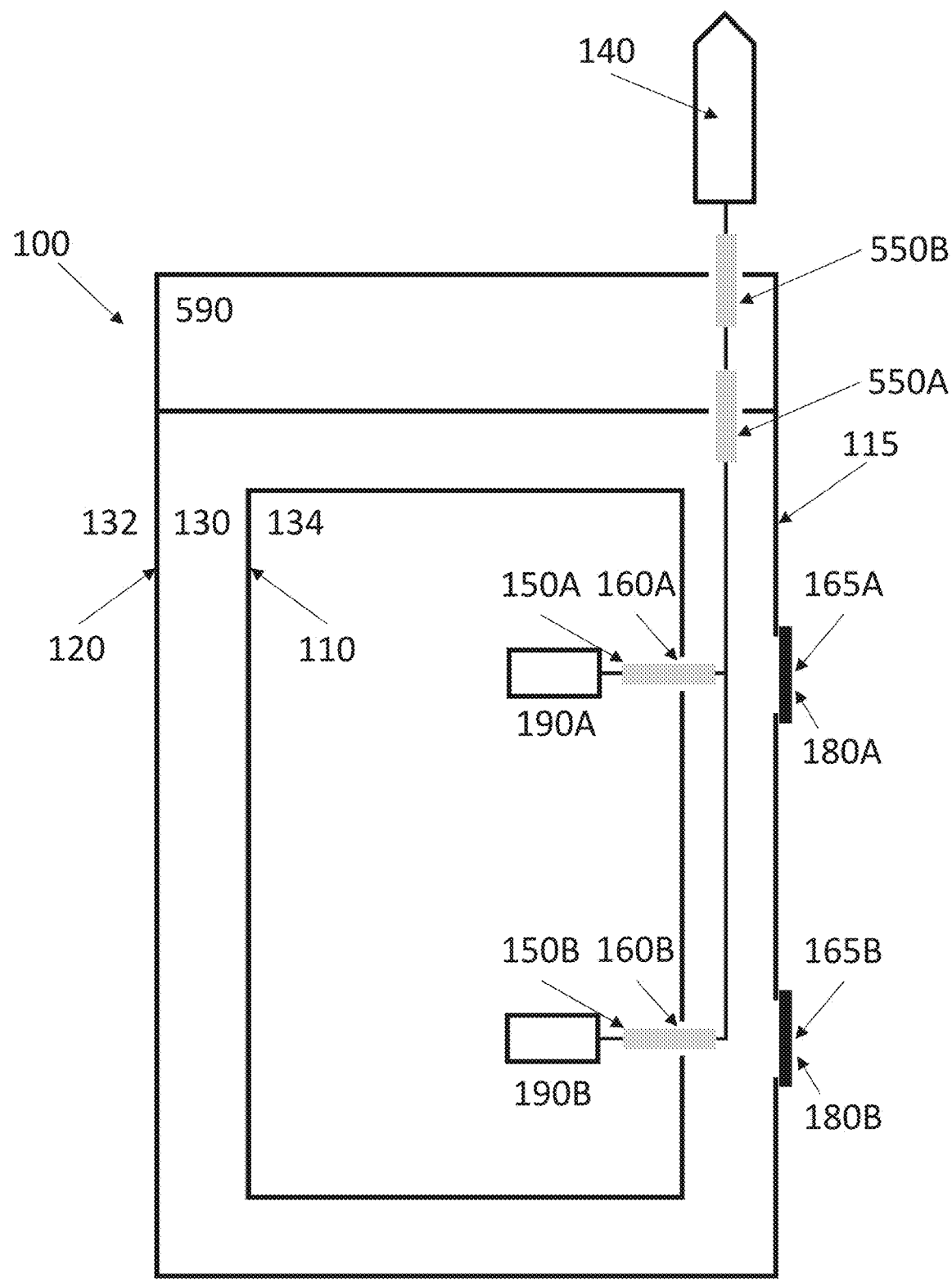
FIGS. 5A-5B illustrate an exemplary embodiment wherein the top of the double-walled cabinet is openable.
Figure 5B:
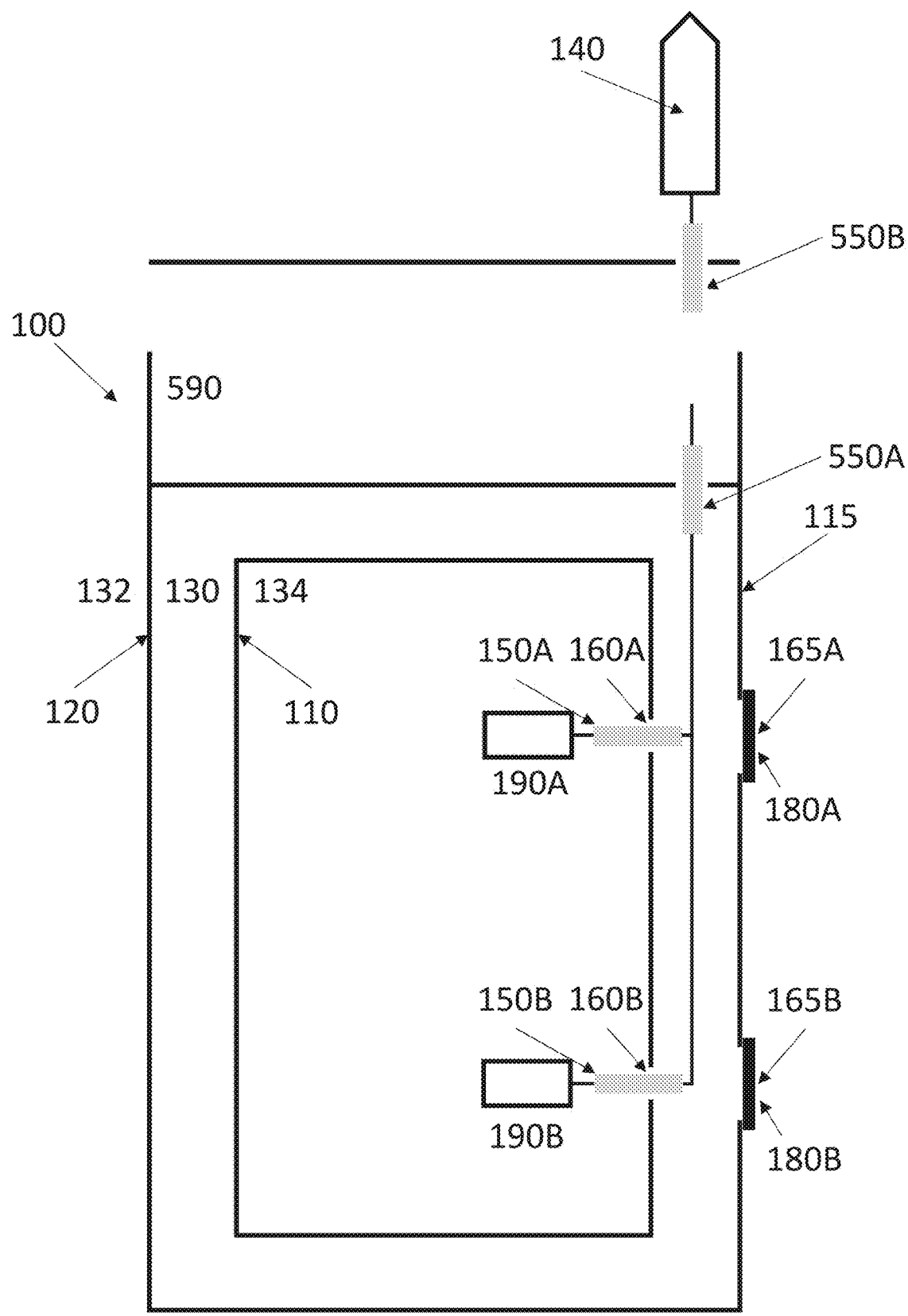

FIGS. 5A and 5B illustrate an embodiment wherein top 590 of the double-walled cabinet 100 is openable. Various mechanisms known to one of ordinary skill in the art have been contemplated to allow the opening/closing of top 590. For example, top 590 may be frictionally fit; additionally or alternatively, top 590 may comprise a hinge or alternative mechanism to assist with opening top 590. In embodiments comprising openable top 590, the openable top 590 may comprise two bulkhead fittings (e.g. bulkhead fittings 550A-B) to help provide an electrical connection between the internal electronics 190A, 190B and the external electronics 140. In such examples, the bulkhead fittings 550A and 550B may allow for a user to open top 590, such as for maintenance. As shown in FIG. 5B, when top 590 is opened, the wire may disconnect from bulkhead fitting 550A allowing a user to access the inside of the panel. In alternative embodiments, the wire may stay connected to bulkhead fitting 550A when top 590 is opened. In such embodiments, there may be enough wire to allow top 590 to be fully opened, or enough wire to allow top 590 to be partially opened and then disconnected to fully open.

Various embodiments have been described. Such examples are non-limiting, and do not define or limit the scope of the invention in any way.

The invention claimed is:

1. A method of installing electronic connections into a Factory Mutual (FM) certified cabinet, the method comprising:
   providing a double walled cabinet, the double walled cabinet comprising:
      an outer cabinet wall,
      an inner cabinet wall, and
      an airgap between the inner cabinet wall and the outer cabinet wall;
   including a first large hole in a surface of the outer cabinet wall;
   including a first small hole in a surface of the inner cabinet wall, the first large hole being larger than the first small hole;
   inserting a first bulkhead fitting into the first small hole in the surface of the inner cabinet wall via the first large hole; and
   covering the first large hole in the surface of the outer cabinet wall.

2. The method of claim 1, wherein the first small hole at least partially overlaps the first large hole when viewed from a plane normal to the first large hole.

3. The method of claim 2, wherein the first small hole is centered in the first large hole when viewed from the plane normal to the first large hole.

4. The method of claim 1, further comprising the step of securing the first bulkhead fitting into the first small hole in the surface of the inner cabinet wall.

5. The method of claim 1, wherein the first large hole allows for a user to insert the first bulkhead fitting into the first small hole.

6. The method of claim 1, wherein the first bulkhead fitting comprises a coaxial bulkhead.

7. The method of claim 1, wherein covering the first large hole in the outer cabinet wall comprises at least one of: (a) welding a first cover around the first large hole and (b) riveting a first cover around the first large hole.

8. The method of claim 1, wherein the first small hole comprises a notch, and inserting the first bulkhead fitting into the first small hole in the surface of the inner cabinet wall via the first large hole further comprises aligning the first bulkhead fitting with the notch.

9. The method of claim 1, further comprising:
including a second large hole in the surface of the outer cabinet wall;
including a second small hole in the surface of the inner cabinet wall, the second large hole being larger than the second small hole;
inserting a second bulkhead fitting into the second small hole in the surface of the inner cabinet wall via the second large hole; and
covering the second large hole in the surface of the outer cabinet wall with a cover.

10. The method of claim 9, wherein covering the first large hole and the second large hole in the surface of the outer cabinet wall comprises using a single cover.

11. The method of claim 9, wherein covering the first large hole and the second large hole in the surface of the outer cabinet wall comprises using multiple covers.

12. The method of claim 1, further comprising:
including one or more additional small holes in the surface of the inner cabinet wall, the first large hole being larger than the one or more additional small holes; and
inserting one or more additional bulkhead fittings into each respective one or more additional small holes in the surface of the inner cabinet wall via the first large hole.

13. A method of installing electronic connections into a Factory Mutual (FM) certified cabinet, the method comprising:
providing a double walled cabinet, the double walled cabinet comprising:
an outer cabinet wall,
an inner cabinet wall, and
an airgap between the inner cabinet wall and the outer cabinet wall; and
for each of a plurality of bulkhead fittings:
including a large hole in a surface of the outer cabinet wall;
including a small hole in a surface of the inner cabinet wall, the large hole being larger than the small hole;
inserting the bulkhead fitting into the small hole in the surface of the inner cabinet wall via the large hole; and
covering the large hole in the surface of the outer cabinet wall.

14. The method of claim 13, wherein each small hole at least partially overlaps with the respective large hole when viewed from a plane normal to the respective large hole.

15. The method of claim 14, wherein each small hole is centered in the respective large hole when viewed from the plane normal to the respective large hole.

16. The method of claim 13, comprising four bulkhead fittings.

17. The method of claim 16, wherein each of the four bulkhead fittings is inserted into at least one of: (a) the same side of the double walled cabinet; and (b) a backside of the double walled cabinet.

18. The method of claim 13, wherein covering each large hole in the outer cabinet wall comprises securing a cover around the respective large hole, wherein securing the cover comprises at least one of: (a) welding the cover around the respective large hole and (b) riveting the cover around the respective large hole.

19. The method of claim 13, wherein each small hole comprises a notch, and inserting the bulkhead fitting into the small hole in the surface of the inner cabinet wall via the large hole further comprises aligning the bulkhead fitting with the notch.

20. A method of installing electronic connections into an Factory Mutual (FM) certified cabinet, the method comprising:
providing a double walled cabinet, the double walled cabinet comprising:
an outer cabinet wall,
an inner cabinet wall, and
an airgap between the inner cabinet wall and the outer cabinet wall;
one or more large holes in a surface of the outer cabinet wall;
for each of a plurality of bulkhead fittings:
including a small hole in a surface of the inner cabinet wall, the large hole being larger than the small hole;
inserting the bulkhead fitting into the small hole in the surface of the inner cabinet wall via one of the one or more large holes; and
covering the one or more large holes in the surface of the outer cabinet wall.

* * * * *